United States Patent
Lin et al.

(10) Patent No.: US 8,809,905 B2
(45) Date of Patent: Aug. 19, 2014

(54) VERTICAL BJT AND SCR FOR ESD

(75) Inventors: Wun-Jie Lin, Hsin-Chu (TW);
Ching-Hsiung Lo, Jhubei (TW);
Jen-Chou Tseng, Jhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 133 days.

(21) Appl. No.: 13/339,189

(22) Filed: Dec. 28, 2011

(65) Prior Publication Data

US 2013/0168732 A1 Jul. 4, 2013

(51) Int. Cl.
*H01L 29/66* (2006.01)
(52) U.S. Cl.
USPC .................................. 257/173; 257/E29.174
(58) Field of Classification Search
USPC .......................................... 257/173, E29.174
See application file for complete search history.

(56) References Cited

U.S. PATENT DOCUMENTS

| | | | |
|---|---|---|---|
| 6,338,986 B1 | 1/2002 | Kawazoe et al. | |
| 6,850,397 B2 | 2/2005 | Russ et al. | |
| 7,244,991 B2 | 7/2007 | Ohsawa | |
| 7,964,893 B2 | 6/2011 | Lee | |
| 2010/0148265 A1 | 6/2010 | Lin et al. | |
| 2011/0299327 A1* | 12/2011 | Asa | ............................. 365/156 |

FOREIGN PATENT DOCUMENTS

JP 2001320366 A 11/2001

OTHER PUBLICATIONS

Korean Office Action with English translation for Application No. 10-2012-0024428, mailed Jun. 25, 2013, 10 pages.

* cited by examiner

*Primary Examiner* — Matthew Reames
(74) *Attorney, Agent, or Firm* — Slater and Matsil, L.L.P.

(57) ABSTRACT

An electrostatic discharge (ESD) protection device includes a well region formed from semiconductor material with a first doping type and a floating base formed from semiconductor material with a second doping type. The floating base is disposed vertically above the well region. The ESD also includes a first terminal receiving region formed from semiconductor material with a third doping type. The first terminal receiving region is disposed vertically above the floating base. The ESD further includes a second terminal receiving region. The second terminal receiving region is laterally spaced apart from the first terminal receiving region by silicon trench isolation (STI) region. In some embodiments, the second terminal receiving region is formed from semiconductor material with the third doping type to form a bipolar junction transmitter (BJT) or with a fourth doping type to form a silicon controlled rectifier (SCR).

20 Claims, 5 Drawing Sheets

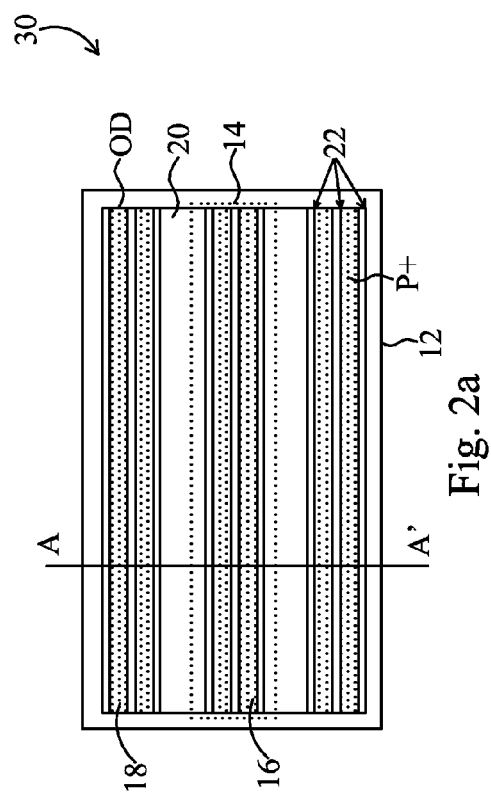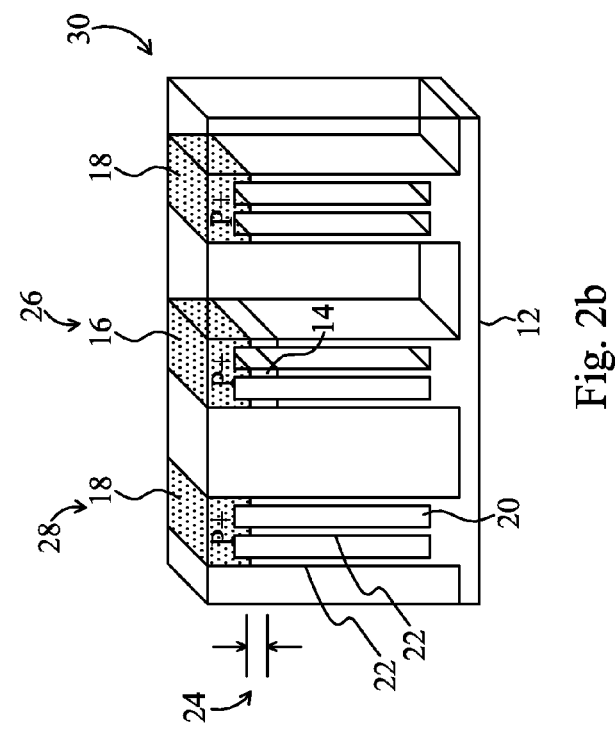

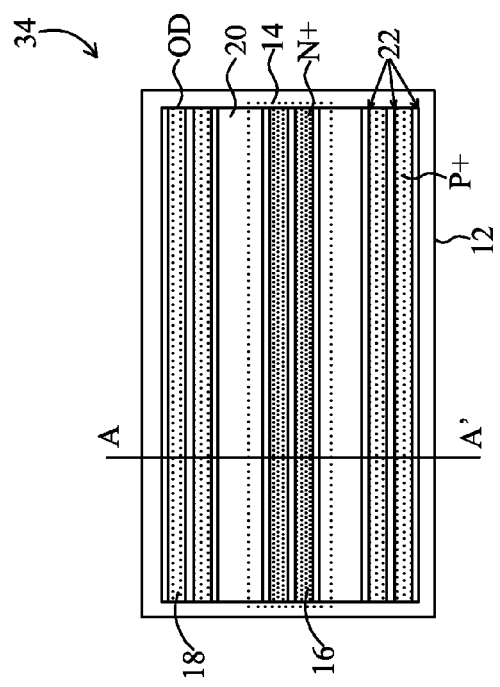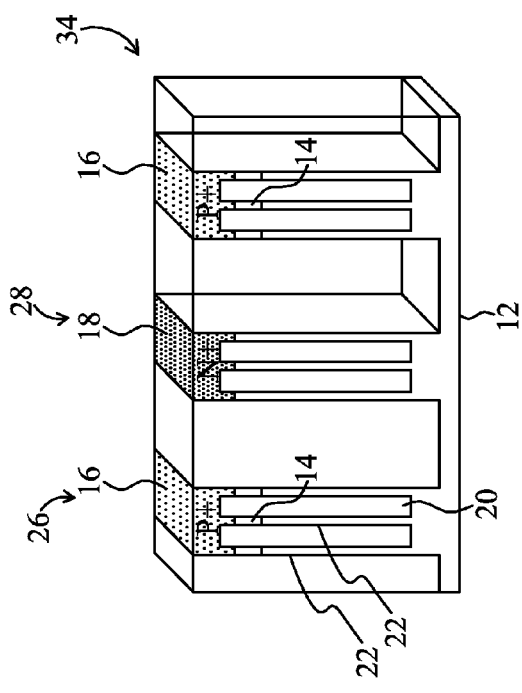

VERTICAL BJT AND SCR FOR ESD

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors will be used in sub 32 nm transistor nodes. For example, FinFETs not only improve areal density but also improve gate control of the channel.

Bipolar junction transistors (BJTs) and FETs require different structures and hence typically are fabricated using different fabrication processes. Merely adding a BJT process sequence to an FET process sequence results in an increase in the number of process steps, many of which are redundant. Further, if some of the BJT processes are different from the FET processes, they require separate development, thus increasing the process cost. Generally, in IC fabrication, it is desirable to reduce the total number of processing steps and use existing processes to avoid independent process development. Hence, to reduce costs, BJTs and FETs may be fabricated using a common process. However, such fabrication introduces a number of process and design challenges, especially with introduction of FinFET devices.

Another goal of the semiconductor industry is to protect electronic devices and systems from electrostatic discharge (ESD), which is one of the main factors of electrical overstress (EOS). If EOS due to ESD occurs, unprotected integrated circuits (ICs) in electronic devices and systems may be permanently damaged. Any damage to the ICs in the electronic devices or systems may lead to abnormal operation of electronic products. Accordingly, a number of methods have been developed to protect semiconductor IC devices against possible ESD damage.

BRIEF DESCRIPTION OF THE DRAWINGS

For a more complete understanding of the present invention, and the advantages thereof, reference is now made to the following descriptions taken in conjunction with the accompanying drawing, in which:

FIG. 2a is a plan view of an electrostatic discharge (ESD) protection device forming a vertical p-n-p bipolar junction transistor (BJT);

FIG. 2b is a cross section of the ESD protection device of FIG. 2a taken generally along line A-A';

FIG. 4a is a plan view of an electrostatic discharge (ESD) protection device forming a vertical p-n-p-n silicon controlled rectifier (SCR);

FIG. 4b is a cross section of the ESD protection device of FIG. 4a taken generally along line A-A'.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an electrostatic discharge (ESD) protection device formed using a fin field-effect transistor (FinFET) complimentary metal-oxide-semiconductor (CMOS) process flow. The invention may also be applied, however, to other types of semiconductor structures or circuits.

Figure 1A:
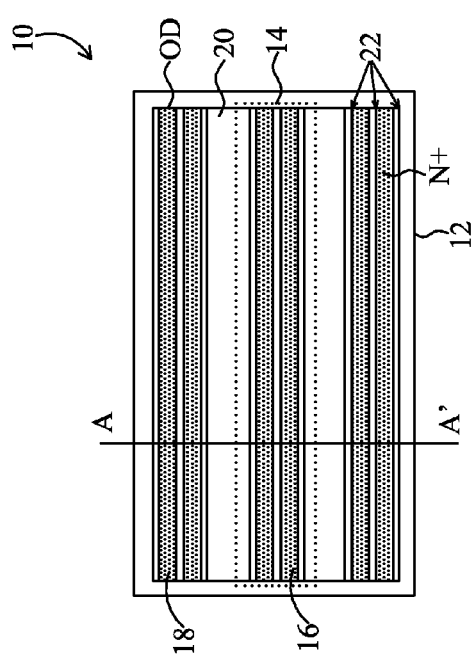
FIG. 1a is a plan view of an electrostatic discharge (ESD) protection device forming a vertical n-p-n bipolar junction transistor (BJT)
Figure 1B:
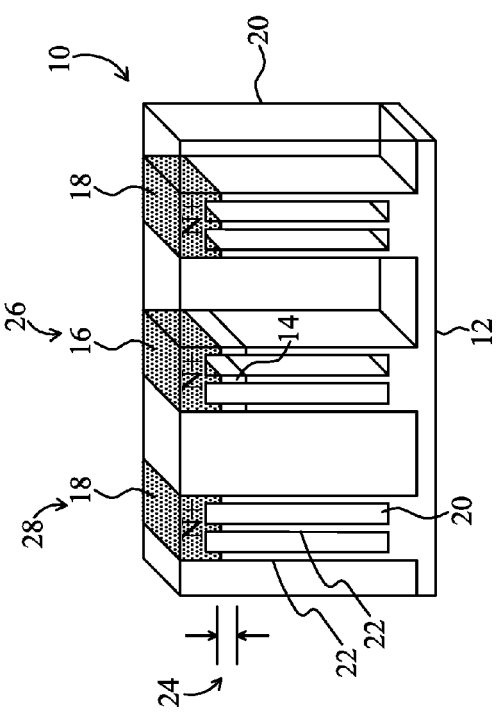
FIG. 1b is a cross section of the ESD protection device of FIG. 1a taken generally along line A-A'.

Referring concurrently to FIGS. 1a-1b, an ESD protection device 10 is illustrated. As will be more fully explained below, the ESD protection device 10 may be used to protect electronic devices or systems from damage due to electrical overstress (EOS) and prevent abnormal operation of electronic products. As shown in FIGS. 1a-1b, the ESD protection device 10 includes a well region 12, a floating base 14, a first terminal receiving region 16, a second terminal receiving region 18, and a silicon trench isolation (STI) region 20.

The well region 12 is formed from semiconductor material such as, for example, silicon. As shown in FIGS. 1a-1b, an n-type impurity implantation process has been performed to provide the well region 12 with an n-type doping. In some embodiments, in-situ doping may be performed to introduce impurities into the well region 12.

Still referring to FIGS. 1a-1b, in some embodiments the well region 12 supports or includes a portion of several fins 22. While nine fins 22 are depicted in FIGS. 1a-1b, in some embodiments more or fewer of the fins may be provided. In addition, while the fins 22 of FIGS. 1a-1b are generally arranged in groups of three, in some embodiments the groups of fins 22 may be smaller or larger. Indeed, in some embodiments a single fin 22 may be included in each group.

The floating base 14 is also formed from semiconductor material such as, for example, silicon. As shown in FIGS. 1a-1b, a p-type impurity implantation process has been performed to provide the floating base 14 with a p-type doping. In some embodiments, in-situ doping may be performed to introduce impurities into the floating base 14.

As oriented in FIGS. 1a-1b, the floating base 14 is vertically disposed above the well region 12. Moreover, the floating base 14 is interposed between the well region 12 and the first terminal receiving region 16. In some embodiments, the floating base 14 is in direct contact with, and abuts against, the well region 12, the first contact receiving region 16, or both.

The floating base 14 defines a base length 24. In some embodiments, the base length 24 is determined by measuring the distance between the first contact receiving region 16 and the n-well region 12. In some embodiments, the base length 24 is determined by measuring a lateral portion or edge of the floating base 14. As shown in FIGS. 1a-1b, the lateral portions of the floating base 24 are in direct contact with the STI region 20.

In embodiments where the well region 12 supports or includes a portion of several fins 22, the floating base 14 is formed from an upper portion of selected ones of the fins 22 (i.e., the fins 22 disposed directly vertically below the first contact receiving region 16). As shown in FIGS. 1a-1b, the upper portion of the fins 22 is subjected to a p-type impurity implantation process to provide the floating base 14 with a p-type doping. As shown in FIG. 1b, the floating base 14 is not directly connected to a contact or terminal.

The first terminal receiving region 16 is an epitaxially grown semiconductor material disposed vertically above the floating base 14. In some embodiments, the first terminal receiving region 16 is in direct contact with the floating base 14. As shown, the first terminal receiving region 16 is configured to function as an anode 26 electrically coupled to a high voltage source.

As shown in FIGS. 1a-1b, the first terminal receiving region 16 has been subjected to an n-type impurity implantation process. In some embodiments, the first terminal receiving region 16 is heavily doped. Throughout the description, the term "heavily doped" indicates impurity concentrations of greater than about $10^{20}/cm^3$. However, it is appreciated that the term "heavily doped" is a term of art, and is related to the specific technology generation used for forming the integrated circuits of the embodiments. In some embodiments, in-situ doping may be performed to introduce impurities into the first terminal receiving region 16.

The second terminal receiving region 18 is an epitaxially grown semiconductor material laterally spaced apart from the first terminal receiving region 16 by the STI region 18. As shown in FIGS. 1a-1b, the second terminal receiving region 18 has also been subjected to an n-type impurity implantation process. In some embodiments, the second terminal receiving region 18 is heavily doped. As shown, the second terminal receiving region 18 is configured to function as a cathode 28 electrically coupled to a low voltage source relative to the anode 26.

Still referring to FIGS. 1a-1b, the STI region 20 is generally disposed over the well region 12, between the fins 22, and over the floating base 14. As shown, the second terminal receiving region 18 is isolated from the first terminal receiving region 16 by the STI region 20. The STI region 20 may be formed by etching a silicon substrate to form recesses and then filling the recesses with a dielectric material such as, for example, high-density plasma (HDP) oxide, TEOS oxide, or the like. With the STI region 20 in place, a vertical n-p-n bipolar junction transmitter (BJT) configured to operate and perform as the ESD device 10 is formed.

Referring concurrently to FIGS. 2a-2b, another embodiment of an ESD protection device 32 is illustrated. Where possible, like reference numerals have been used with like or similar elements throughout the detailed description. In addition, a full description of like or similar elements has been omitted. As shown in FIGS. 2a-2b, the ESD protection device 32 has a p-type doped well region 12, an n-type doped floating base 14, and heavily doped p-type first and second terminal receiving regions 16, 18 separated by the STI layer 22 to form a vertical p-n-p bipolar junction transmitter (BJT) configured to operate and perform as the ESD device 30. As shown, the first terminal receiving region 16 is configured to function as the anode 26 and the second terminal receiving region 18 is configured to function as the cathode 28.

Figure 3A:
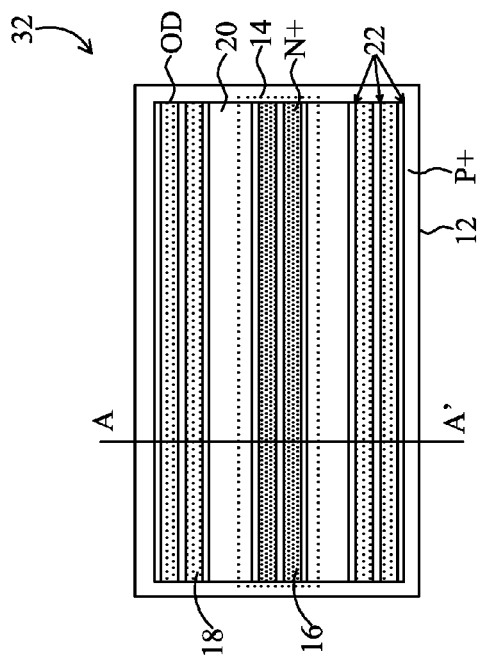
FIG. 3a is a plan view of an electrostatic discharge (ESD) protection device forming a vertical p-n-p-n silicon controlled rectifier (SCR)
Figure 3B:
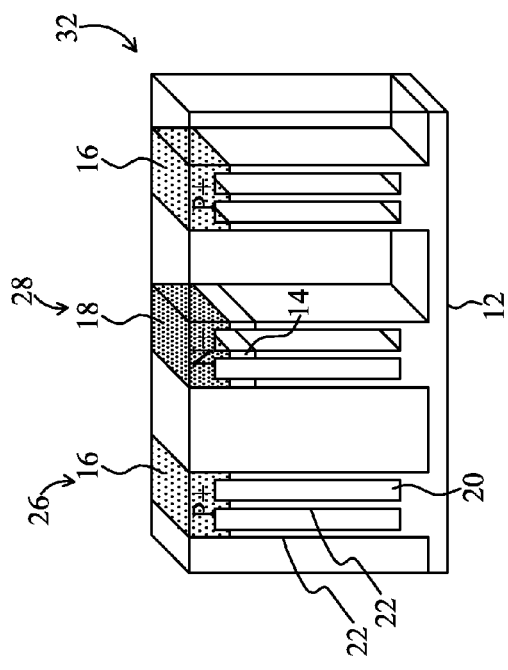
FIG. 3b is a cross section of the ESD protection device of FIG. 3a taken generally along line A-A'.

Referring concurrently to FIGS. 3a and 3b, another embodiment of an ESD protection device 36 is illustrated. As shown in FIGS. 3a-3b, the ESD protection device 36 has an n-type doped well region 12, a p-type doped floating base 14, a heavily doped n-type first terminal receiving region 16, and a heavily doped p-type second terminal receiving region 18. The first and second terminal receiving regions 16, 18 are separated by the STI layer 22 to form a vertical p-n-p-n silicon controlled rectifier (SCR) configured to operate and perform as the ESD device 32. Unlike ESD protection devices 10, 30, for the ESD protection device 32 the first terminal receiving region 16 is configured to function as the cathode 28 and the second terminal receiving region 18 is configured to function as the anode 26.

Referring concurrently to FIGS. 4a and 4b, another embodiment of an ESD protection device 34 is illustrated. As shown in FIGS. 4a-4b, the ESD protection device 34 has a p-type doped well region 12, an n-type doped floating base 14, a heavily doped p-type first terminal receiving region 16, and a heavily doped n-type second terminal receiving region 18. The first and second terminal receiving regions 16, 18 are separated by the STI layer 22 to form a vertical p-n-p-n silicon controlled rectifier (SCR) configured to operate and perform as the ESD device 34. As shown, the first terminal receiving region 16 is configured to function as the anode 26 and the second terminal receiving region 18 is configured to function as the cathode 28.

Figure 5:
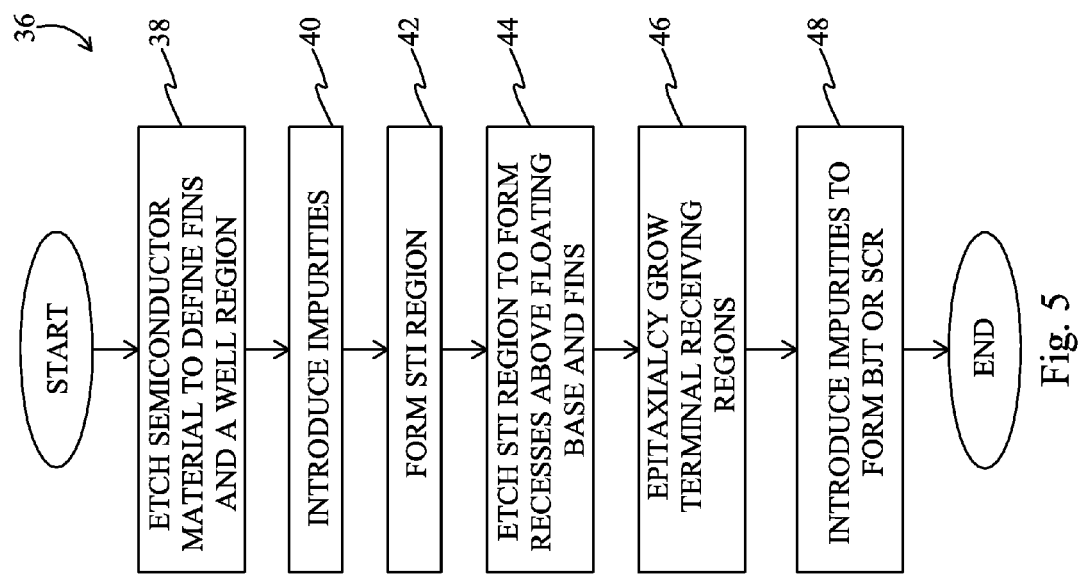
FIG. 5 is a flowchart illustrating a method of forming the ESD protection device.

Referring now to FIG. 5, a method 36 of forming the ESD protection device 10, 30-34 is illustrated. In block 36, a semiconductor material with a first doping type is etched to define fins 22 and a well region 12. In other embodiments, the fins 22 can be epitaxially grown from the well region 12. In block 40, impurities of a second doping type are introduced into an upper portion of selected ones of the fins 22 to form a floating base 14. In block 42, the STI region is formed over the well region 12, between the fins 22, and over the floating base 14. In block 44, the STI region 20 is etched to form recesses directly above the floating base 14 and remaining ones of the fins 22. In block 46, semiconductor material is epitaxially grown in the recesses to form the first and second terminal receiving regions 16, 18. In block 48, impurities are introduced into the first and second terminal receiving regions 16, 18.

In some embodiments, impurities are introduced into the first and second terminal receiving regions 16, 18 to form a bipolar junction transistor (BJT) configured to operate as the ESD protection device 10, 30. In some embodiments, impurities are introduced into the first and second terminal receiving regions 16, 18 to form a silicon controlled rectifier (SCR) configured to operate as the ESD protection device 32, 34.

Those skilled in the art will recognize from the foregoing that the ESD protection devices 10, 30-34 are compatible with complementary metal oxide semiconductor (CMOS) and FinFET process flows. The vertical ESD protection devices 10, 30-34 also provide more robust protection relative to known lateral BJT ESD devices. In addition, the vertical discharge found in the ESD protection devices 10, 30-34 is more efficient than the lateral discharge in a FinFET process. Moreover, base-floating can lower trigger or "turn on" voltage during an ESD event due to a short base length 24 relative to other known ESD protection devices. Finally, the ESD protection devices 10, 30-34 have an adaptable holding voltage and a deeper ESD discharge path for better thermal dissipation.

An electrostatic discharge (ESD) protection device comprises a well region formed from semiconductor material with a first doping type, a floating base formed from semiconductor material with a second doping type, the floating base disposed vertically above the well region, a first terminal receiving region formed from semiconductor material with a third doping type, the first terminal receiving region disposed vertically above the floating base; and a second terminal receiving region formed from semiconductor material with the third doping type, the second terminal receiving region laterally spaced apart from the first terminal receiving region by a silicon trench isolation (STI) region to form a bipolar junction transmitter (BJT).

An electrostatic discharge (ESD) protection device comprises a well region formed from semiconductor material with a first doping type, a floating base formed from semiconductor material with a second doping type, the floating base disposed vertically above the well region, a first terminal receiving region formed from semiconductor material with a third doping type, the first terminal receiving region disposed vertically above the floating base; and a second terminal receiving region formed from semiconductor material with a fourth doping type, the second terminal receiving region laterally spaced apart from the first terminal receiving region by a silicon trench isolation (STI) region to form a silicon controlled rectifier (SCR).

A method of forming an ESD protection device comprises etching a semiconductor material with a first doping type to define fins and a well region, introducing impurities of a second doping type into an upper portion of selected ones of the fins to form a floating base, forming a silicon trench isolation (STI) region over the well region, between the fins, over the floating base, etching the STI region to form recesses directly above the floating base and remaining ones of the fins, epitaxially growing semiconductor material in the recesses to form a first terminal receiving region and a second terminal receiving region, and introducing impurities into the first terminal receiving region and the second terminal receiving region.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electrostatic discharge (ESD) protection device, comprising:
    a well region formed from semiconductor material with a first doping type;
    a floating base formed from semiconductor material with a second doping type, the floating base disposed vertically above the well region;
    a first terminal receiving region formed from semiconductor material with a third doping type, the first terminal receiving region disposed vertically above the floating base; and
    a second terminal receiving region formed from semiconductor material with the third doping type, the second terminal receiving region in contact with the well region and laterally spaced apart from the first terminal receiving region by a silicon trench isolation (STI) region to form a bipolar junction transmitter (BJT).

2. The ESD protection device of claim 1, wherein the floating base is in direct contact with the well region and the first terminal receiving region.

3. The ESD protection device of claim 1, wherein lateral portions of the floating base are in direct contact with the STI region.

4. The ESD protection device of claim 1, wherein a portion of the well region is formed from at least one fin.

5. The ESD protection device of claim 1, wherein the floating base is formed from at least one fin.

6. The ESD protection device of claim 1, wherein the semiconductor material with the first doping type is an n-type, the semiconductor material with the second doping type is a p-type, and the semiconductor material with the third doping type is a heavily doped n-type relative to the n-type.

7. The ESD protection device of claim 1, wherein the semiconductor material with the first doping type is a p-type, the semiconductor material with the second doping type is a n-type, and the semiconductor material with the third doping type is a heavily doped p-type relative to the p-type.

8. The ESD protection device of claim 1, wherein the semiconductor material forming the first terminal receiving region and the second terminal receiving region are an epitaxially grown semiconductor material.

9. An electrostatic discharge (ESD) protection device, comprising:
    a well region formed from semiconductor material with a first doping type;
    a floating base formed from semiconductor material with a second doping type, the floating base disposed vertically above the well region;
    a first terminal receiving region formed from semiconductor material with a third doping type, the first terminal receiving region disposed vertically above the floating base; and
    a second terminal receiving region formed from semiconductor material with a fourth doping type, the second terminal receiving region in contact with the well region and laterally spaced apart from the first terminal receiving region by a silicon trench isolation (STI) region to form a silicon controlled rectifier (SCR).

10. The ESD protection device of claim 9, wherein the floating base is in direct contact with the well region and the second terminal receiving region.

11. The ESD protection device of claim 9, wherein the floating base is in direct contact with the well region and the first terminal receiving region.

12. The ESD protection device of claim 9, wherein lateral portions of the floating base are in direct contact with the STI region.

13. The ESD protection device of claim 9, wherein a portion of the well region is formed from at least one fin.

14. The ESD protection device of claim 9, wherein the floating base is formed from at least one fin.

15. The ESD protection device of claim 9, wherein the semiconductor material with the first doping type is an n-type, the semiconductor material with the second doping type is a p-type, the semiconductor material with the third doping type is a heavily doped n-type relative to the n-type, and the semiconductor material with the fourth doping type is a heavily doped p-type relative to the p-type.

16. The ESD protection device of claim 9, wherein the semiconductor material with the first doping type is a p-type, the semiconductor material with the second doping type is a n-type, the semiconductor material with the third doping type is a heavily doped p-type relative to the p-type, and the semiconductor material with the fourth doping type is a heavily doped n-type relative to the n-type.

17. The ESD protection device of claim 9, wherein the semiconductor material forming the first terminal receiving region and the second terminal receiving region are an epitaxially grown semiconductor material.

18. A method of forming an ESD protection device, comprising:
- etching a semiconductor material with a first doping type to define fins and a well region;
- introducing impurities of a second doping type into an upper portion of selected ones of the fins to form a floating base;
- forming a silicon trench isolation (STI) region over the well region, between the fins, over the floating base;
- etching the STI region to form recesses directly above the floating base and remaining ones of the fins;
- epitaxially growing semiconductor material in the recesses to form a first terminal receiving region and a second terminal receiving region, the second terminal receiving region in contact with the well region; and
- introducing impurities into the first terminal receiving region and the second terminal receiving region.

19. The method of claim 18, further comprising introducing impurities of a third type into the first terminal receiving region and of the third type into the second terminal receiving region to form a bipolar junction transistor (BJT).

20. The method of claim 18, further comprising further comprising introducing impurities of a third type into the first terminal receiving region and of a fourth type into the second terminal receiving region to form a silicon controlled rectifier (SCR).

* * * * *